United States Patent [19]

Clark, Jr. et al.

[11] Patent Number: 5,327,625
[45] Date of Patent: Jul. 12, 1994

[54] APPARATUS FOR FORMING NANOMETRIC FEATURES ON SURFACES

[75] Inventors: Harry R. Clark, Jr., Towsend; Gerald W. Iseler, Chelmsford; Brian S. Ahern, Boxboro, all of Mass.

[73] Assignees: Massachusetts Institute of Technology, Cambridge, Mass.; United States of America, Washington, D.C.

[21] Appl. No.: 929,341

[22] Filed: Aug. 13, 1992

[51] Int. Cl.⁵ .............................................. B26D 3/06
[52] U.S. Cl. ...................................... 29/25.01; 83/74; 83/76.8; 83/76.9; 83/368; 83/881; 125/23.01
[58] Field of Search ................... 29/25.01; 125/23.01; 83/881, 74, 76.8, 76.9, 368

[56] References Cited

FOREIGN PATENT DOCUMENTS

1-186308  7/1989  Japan ................. 125/23.01

OTHER PUBLICATIONS

L. F. Cooley, "A finely controlled scriber for fragile semiconductor materials", Research Disclosure, No. 183, pp. 381–382, Jul. 1979.
World Watch, "Grooved Surface Reported to Improve Efficiency", Sep. 1991, pp. 37–38.
Johansson & Schweitz, "Contact Damage in . . . Microscopy," J. Am. Ceram. Soc., 71(8): 617–623 (1988), month unknown.
Kratschmer et al., "Piezo Locking Stage . . . Lithography," J. Vac. Sci. Technol. B7(6): 1418–1421 (Nov./Dec. 1989).
Chitayet, "Nanometer X-Y Positioning Stages for . . . Stepping," J. Vac. Sci. Technol., B7(6): 1412–1417 (Nov./Dec. 1989).
Watson et al., "The Thermal Stability of Lattice . . . GaAs," J. of Elec. Materials, 20(10): 703–708 (1991), month unknown.
Fitzgerald et al., "Nucleation mechanisms an the . . . Area," J. Appl. Phys., 65(6): 2220–2237 (1989) month unknown.
Ismail et al., "High-Quality GaAs on Sawtooth-Patterned Si Substrates," Appl. Phys. Lett., 59(19): 2418–2420 (Nov. 4, 1991).
Hashimoto et al., "GaAs Growth Properties on V--Grooved Si Substrates," Appl. Phys. Lett. 54(11): 998–1000 (Mar. 13, 1989).
Kapon et al., "Patterned Auantum Well Semiconductor Laser Arrays," Appl. Phys. Lett., 54(4): 304–306 (Jan. 23, 1989.
Nishiguchi et al., "Mechanical Thinning of InP Wafer by Grinding," J. Electrochem. Soc., 138(6): 1826–1830 (Jun. 1991).
Bifano et al., "Ductile-regime grinding of brittle materials: Experimental . . . Model, " SPIE, 966:108–115 (1988) month unknown.

*Primary Examiner*—Olik Chaudhuri
*Assistant Examiner*—Ourmazd S. Ojan
*Attorney, Agent, or Firm*—Hamilton, Brook, Smith & Reynolds

[57] ABSTRACT

An instrument for forming nanometric features on surfaces of materials having a motor driven support for moving a workpiece on an X-Y-Z axis, a scribing tool of nanometric proportion engagable with the workpiece and a laser system for sensing movement. The tool is mounted on piezoelectric actuating means and the entire system is under the control of a programmed computer processing unit.

2 Claims, 1 Drawing Sheet

APPARATUS FOR FORMING NANOMETRIC FEATURES ON SURFACES

This invention was made with government support under contract Number F19628-90-C-0002 awarded by the Air Force. The government has certain rights in the invention.

BACKGROUND OF THE INVENTION

The future of modern day technology and particularly computer technology demands smaller, faster and more reliable electronic devices. Unfortunately, simply extending existing technology by forming devices having smaller dimensional features presents limitations. Once feature sizes of electronic devices pass below 100 nm (nanometers), a fundamental shift in operation can be expected due to quantum mechanical effects. At these nanoscale dimensions, quantum interference effects will dominate. However, conventional device technology has not yet attained nanoscale features in which quantum effects dominate.

Yet quantum interference devices (QIDs) continue to receive serious attention because of their potential for unique transistor devices with excellent power delay products. Some QID structures could be turned on optically to circumvent the RC time constant and carrier lifetime limitations. For such devices, switching times of one picosecond and power delay products of 200 fJ (femto Joules) are predicted.

Quantum well structures have been widely demonstrated in thin planar structures. Quantum wires and dots require the fabrication of nanoscale features onto these planar structures. To date, researchers have fabricated features as small as 100 nm by lithographic techniques. However, because of the large amount of time required to form a feature, such lithographic techniques are generally unsuitable for large scale fabrication of nanoscale features.

One significant problem related to the fabrication of nanoscale features in surfaces of materials is process induced damage to the underlying region of the material. For example, process induced damage in semiconductors is a source of great concern. Recent studies indicate that what has been viewed as subsurface damage can be attributed to secondary effects such as inhomogeneous surface contamination. Other studies have shown that an inhomogeneous oxide can lead to irregular etching of a semiconductor surface which had been previously attributed to subsurface damage.

Mechanical material removal processes generally can be reduced to an energetics argument. In "Ductile-Regime Grinding of Brittle Materials," by T. G. Bifano, SPIE, Vol. 966 (1988), it was found that material removal from a surface of a material fundamentally changes as the volumetric removal rate is decreased. The energy required for brittle fracture (Ef) of the material is:

$$E_f = (G)(A_f)$$

where,

G = the Griffith crack propagation parameter and
$A_f$ = the area of the new surface created.

The energy required for plastic deformation ($E_p$) of the material is:

$$E_p = (\sigma_y)(V_p)$$

where, $\sigma_y$ = the yield stress and
$V_p$ = the volume of material to be plastically deformed. Since $V_p$ is proportional to $d^3$ and $A_f$ is proportional to $d^2$, where d is a distance related to removal depth, then $E_p$ is proportional to $d^3$ and $E_f$ is proportional to $d^2$. Therefore, as the depth (d) of the material removal process is reduced, the energy required for brittle fracture ($E_f$) becomes greater than the energy required for ductile material removal ($E_p$). Once this condition occurs, the material removal shifts from brittle to predominately ductile material removal. This behavior has been confirmed in grinding studies on GaAs and InP (see Journal of Elec. Chem. Soc. Vol. 138, p. 1826, (1991)).

By convention, researchers have assumed that the depth of subsurface damage resulting from material removal processes such as lapping, grinding or polishing is roughly equal to the diameter of the grit. However, a study on silicon conducted at Uppsala University has shown an exponential decrease in subsurface damage as grit size is reduced (see "Micromechanical Properties of Silicon," by S. Johansson, 1988). In the study, it was shown that when the grit size was reduced to 3 microns, the depth of subsurface damage was confined to 50 nm. At grit sizes of 50–70 nm no damage could be measured by cross-sectional transmission microscopy (TEM). In a study of erosion rates on silicon and gallium arsenide surfaces, these same researchers claimed to observe an elastic material removal process. It is to this general problem that the present invention is directed.

SUMMARY OF THE INVENTION

The present invention resides in a method and apparatus for forming nanometric features on surfaces of materials while minimizing subsurface damage. A workpiece such as a semiconductor wafer or layer comprising silicon or gallium arsenide is supported for movement on conventional X-Y-Z axes. Motion may be imparted along all three of the axes, one or two at a time, or all three simultaneously. To scribe the surface of the workpiece in predetermined patterns, the scribing is controlled piezoelectrically during the process. Information indicative of the motion along the X-Y-Z axes is detected and processed. Corrective motion is then applied in nanometric increments in accordance with the processed information.

During the process, surface configurations of the workpiece are also detected to further adjust the scribing of the surface of the workpiece.

The above-described process may be carried out with equipment hereinafter to be described in greater detail, and capable of being controlled to produce motions of nanometric proportions in predetermined patterns. Such equipment includes a support for moving a workpiece of on the X-Y-Z axes. The movement is provided by primary controllable motors. A laser system is employed for sensing the movement along the X-Y-Z axes.

The scribing tool comprises a diamond or other equivalent material having an effective working tip of nanometric proportions. The tool is engagable with the surface of the workpiece and is mounted on piezoelectric actuating means so as to be controllable to finer tolerances than that provided by the primary motor means for producing motion on the X-Y-Z axes.

A computer processing unit is employed for receiving signals from the laser system and, in accordance with predetermined programming, sends signals back to the primary motor means as well as the piezoelectric actuating means in closed loops such that the tool imparts nanometric surface features to the workpiece in patterns which have been previously programmed into the computer.

A probe may be operatively connected to the computer processing unit to detect surface configurations in the workpiece also for initiating changes in the operation of the piezoelectric actuating means.

The above and other features of the invention including various and novel details of construction and combination of parts will now be more particularly described with reference to the accompanying drawings and pointed out in the claims. It will be understood that the particular method and apparatus for forming nanometric features on surfaces embodying the invention are shown by way of illustration only and not as a limitation of the invention. The principles and features of this invention may be employed in varied and numerous embodiments without departing from the scope of the invention.

DETAILED DESCRIPTION

Figure 1:
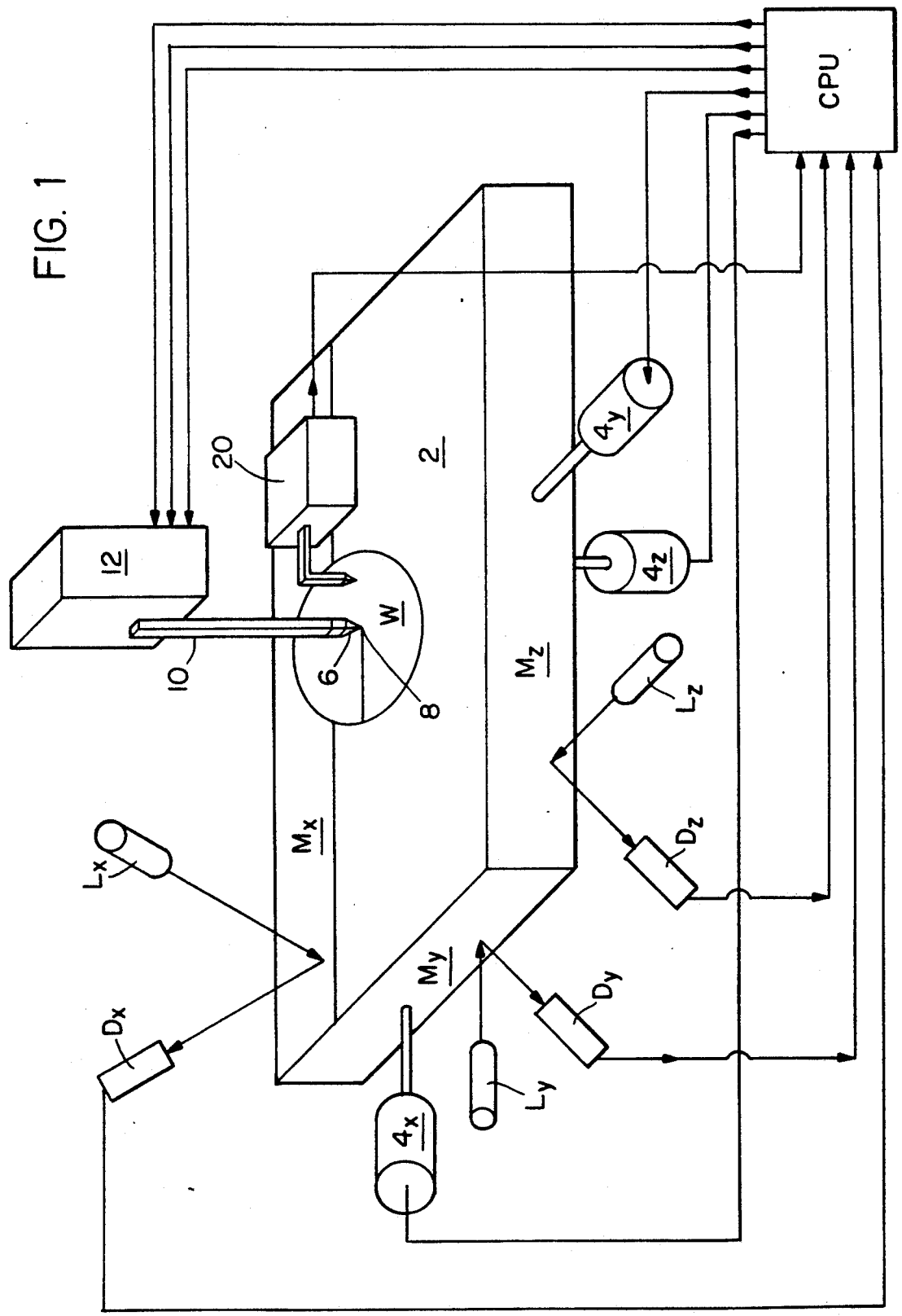
FIG. 1 is a schematic perspective view of an instrument for forming nanometric features on the surface of materials.

The instrument seen in FIG. 1 has a workpiece W such as a semiconductor crystal of silicon or gallium arsenide mounted on a support 2 for movement along conventional X-Y-Z axes. Movement for the support is provided by three primary controller motors which may be either linear or rotary and designated $4_X$, $4_Y$ and $4_Z$, respectively. The motors are connected electrically to a computer processing unit (indicated CPU) which is preprogrammed to direct the forming of the features as well as to process information supplied to it during the operating process and to send signals back to the scribing device.

A tool 6 such as a diamond having a working tip 8 diameter in the general range of 10 nanometers is mounted as, for example, by a rod 10 on a piezoelectric motor device 12. The motor 12 is constructed to produce motion also on X-Y-Z axes of nanometric proportions and is oriented to parallel the axes of the support 2. It is operatively connected to the computer processing unit.

Three laser source means $L_X$, $L_Y$, $L_Z$, are appropriately mounted to project beams on mirror surfaces $M_X$, $M_Y$, $M_Z$, in the direction of the arrows. The beams are reflected by the mirror surfaces into detectors $D_X$, $D_Y$, $D_Z$ which, thus, detect motion of the support 2 and, hence, the workpiece W along the X, Y and Z axes. It will be understood that the laser detection system for detection motion from the Z axis comprising the laser source $L_Z$ and the detector $D_Z$, while shown operating against the vertical surface $M_Z$, are positioned to actually detect vertical motion.

The detectors, sensing motion, convert the information to electric signals which are fed into the computer processing unit CPU. Based upon the motion so detected, the computer sends back to the motors 4X, 4Y and 4Z any corrective motion necessary to permit the tool 6 to carry out the scribing pattern for which the computer was preprogrammed.

A high precision stage detector in the form of, for example, an atomic force probe 20, is mounted to detect surface configurations in the workpiece W and is operatively connected to the computer to send signals representing the various aspects of the surface configuration. This information is also processed in the computer. The computer, upon processing the incoming signals from the atomic force probe, sends out signals to the piezoelectric actuating means 12 to produce relative motion between the tool 6 and the workpiece W of nanometric proportions.

We claim:

1. An instrument for forming nanometric features on surfaces of materials comprising:

a support for moving a workpiece on X-Y-Z axes;

motor means for imparting movement to the support;

a laser system for sensing movement on the X-Y-Z axes;

a scribing tool of nanometric proportions engagable with the workpiece;

piezoelectric actuating means mounting the tool for movement relative to the workpiece; and a computer processing unit for receiving signals from the laser system and programmed to control the motor means and the piezoelectric actuating means in closed loops such that the tool imparts nanometric surface features to the workpiece in predefined patterns.

2. An instrument according to claim 1 wherein a probe connected to the computer processing unit detects surface configurations in the workpiece for initiating changes in the operation of the piezoelectric actuating means.

* * * * *